(12) United States Patent
Luo et al.

(10) Patent No.: US 7,787,321 B2
(45) Date of Patent: Aug. 31, 2010

(54) HIGH PERFORMANCE SENSE AMPLIFIER AND METHOD THEREOF FOR MEMORY SYSTEM

(75) Inventors: Wenzhe Luo, Shanghai (CN); Paul Ouyang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 313 days.

(21) Appl. No.: 11/623,894

(22) Filed: Jan. 17, 2007

(65) Prior Publication Data

US 2007/0189093 A1    Aug. 16, 2007

Related U.S. Application Data

(63) Continuation of application No. 11/253,052, filed on Oct. 17, 2005, now Pat. No. 7,180,804.

(30) Foreign Application Priority Data

Sep. 22, 2005    (CN) .................. 2005 1 0030004

(51) Int. Cl.
*G11C 7/02* (2006.01)
(52) U.S. Cl. .................. 365/208; 365/207; 327/52; 327/53
(58) Field of Classification Search .................. 365/208
See application file for complete search history.

(56) References Cited

U.S. PATENT DOCUMENTS

| | | | |
|---|---|---|---|
| 5,175,451 A | 12/1992 | Ihara | |
| 6,011,413 A | 1/2000 | Hayakawa et al. | |
| 6,205,073 B1 | 3/2001 | Naji | |
| 6,583,667 B1 * | 6/2003 | Dasgupta et al. | 330/254 |
| 6,600,690 B1 | 7/2003 | Nahas et al. | |
| 7,038,959 B2 | 5/2006 | Garni | |
| 7,180,804 B1 * | 2/2007 | Luo et al. | 365/208 |
| 2005/0068807 A1 | 3/2005 | Ohsawa | |
| 2006/0126389 A1 | 6/2006 | Sarig | |

OTHER PUBLICATIONS

Notice of Allowance for U.S. Appl. No. 11/253,052 mailed on Oct. 18, 2006; 7 pages.

* cited by examiner

*Primary Examiner*—Son L Mai
(74) *Attorney, Agent, or Firm*—Townsend and Townsend and Crew LLP

(57) ABSTRACT

A system and method for sensing a current. The system includes an operational amplifier including a first input terminal, a second input terminal, and a first output terminal. The first input terminal is biased to a predetermined voltage, and the second input terminal and the first output terminal are directly connected. Additionally, the system includes a switch coupled to the first output terminal and a first node. The switch is controlled by at least a first control signal. Moreover, the system includes a comparator including a third input terminal, a fourth input terminal, and at least a second output terminal. The comparator is configured to receive a first input signal at the third input terminal and a second input signal at the fourth input terminal. The first input signal and the second input signal are associated with the first node and the predetermined voltage.

20 Claims, 4 Drawing Sheets

HIGH PERFORMANCE SENSE AMPLIFIER AND METHOD THEREOF FOR MEMORY SYSTEM

CROSS-REFERENCES TO RELATED APPLICATIONS

This application is a continuation application of U.S. application Ser. No. 11/253,052, filed Oct. 17, 2005, now U.S. Pat. No. 7,180,804 B1, which claims priority to Chinese Patent Application No. 200510030004.5, filed Sep. 22, 2005, commonly assigned, incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention is directed to integrated circuits. More particularly, the invention provides a system and method for high performance sense amplifier. Merely by way of example, the invention has been applied to a memory system. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process, device layout, and/or system design often work down to only a certain feature size.

An example of such a limit is performance of a sense amplifier. The sensitivity of the sense amplifier affects read operations of a memory system. For a read-only memory (ROM) system, when the devices becomes smaller, the cell current may also become lower. The low cell current often slows down the read operations of the memory system, whose read operations may also become less accurate.

From the above, it is seen that an improved technique for sense amplifier is desired.

BRIEF SUMMARY OF THE INVENTION

The present invention is directed to integrated circuits. More particularly, the invention provides a system and method for high performance sense amplifier. Merely by way of example, the invention has been applied to a memory system. But it would be recognized that the invention has a much broader range of applicability.

In a specific embodiment, the invention provides a system for sensing a current. The system includes an operational amplifier including a first input terminal, a second input terminal, and a first output terminal. The first input terminal is biased to a predetermined voltage, and the second input terminal and the first output terminal are directly connected. Additionally, the system includes a switch coupled to the first output terminal and a first node. The switch is controlled by at least a first control signal. Moreover, the system includes a comparator including a third input terminal, a fourth input terminal, and at least a second output terminal. The comparator is configured to receive a first input signal at the third input terminal and a second input signal at the fourth input terminal. The first input signal and the second input signal are associated with the first node and the predetermined voltage. Also, the system includes a current generator coupled to a second node and configured to generate a first current. The first current flows between the current generator and the second node. The first node and the second node are directly connected, and a second current flows between the first node and the second node. The second node is coupled to a device configured to generate a third current, and the third current flows between the device and the second node.

According to another embodiment of the present invention, a system for sensing a current includes an operational amplifier including a first input terminal, a second input terminal, and a first output terminal. The first input terminal is biased to a predetermined voltage, and the second input terminal and the first output terminal are directly connected. Additionally, the system includes a switch coupled to the first output terminal and a first node, and the switch is controlled by at least a first control signal. Moreover, the system includes a comparator including a third input terminal, a fourth input terminal, and at least a second output terminal. The comparator is configured to receive a first input signal at the third input terminal and a second input signal at the fourth input terminal, and the first input signal and the second input signal being associated with the first node and the predetermined voltage. Also, the system includes a reference generator configured to generate a predetermined current, and a current mirror coupled to the reference generator and a second node and configured to generate a first current. The first current is proportional to the predetermined current. The predetermined current flows from the current mirror to the reference generator, and the first current flows from the current mirror to the second node. The first node and the second node are directly connected. A second current flows between the first node and the second node, and the second node is coupled to a bit line for a memory system. The memory system is configured to generate no current on the bit line or a third current on the bit line. If the memory system generates no current on the bit line, the second current flows from the second node to the first node. If the memory system generates the third current on the bit line, the second current flows from the first node to the second node.

According to yet another embodiment of the present invention, a method for sensing a current includes selecting a memory cell in a memory system. The selected memory cell corresponds to at least a selected bit line, and the memory system is coupled to a sense amplifier. The sense amplifier includes an operational amplifier including a first output terminal substantially biased to a predetermined voltage, a switch coupled to the first output terminal and a first node and controlled by at least a first control signal, a comparator including a first input terminal and a second input terminal, a current generator coupled to a second node and configured to generate a first current flowing between the current generator and the second node. The second node is coupled to the selected bit line, and the first node and the second node are directly connected. The first input terminal and the second input terminal are associated with the first node and the predetermined voltage. Additionally, the method includes turning on the switch by at least the first control signal, adjusting a voltage level at the first node to be substantially equal to the predetermined voltage, and turning off the switch by at least the first control signal. Moreover, the method includes increasing or decreasing the voltage level at the first node from being substantially equal to the predetermined voltage, and detecting a difference between the voltage level at the first node and the predetermined voltage. The selected memory cell is at either a first state or a second state. The increasing or decreasing the voltage level at the first node includes if the selected memory cell is at the fist state increasing the voltage level, and if the selected memory cell is at the second state decreasing the voltage level.

Many benefits are achieved by way of the present invention over conventional techniques. Some embodiments of the present invention provide a system and method for sensitive and fast sense amplifier. For example, the sense amplifier uses an operational amplifier to pre-charge a selected bit line to a reference voltage through an anti-charge-injection switch. After the pre-charging, the bit-line voltage would remain very close to the reference voltage. Certain embodiments of the present invention significantly facilitate read operations of read-only memory (ROM) systems that have low currents. For example, the sensitivity of the read operations are significantly improved. In another example, the speed of the read operations are significantly improved. Some embodiments of the present invention use an operational amplifier to automatically balance a selected bit line to a reference voltage during pre-charging. Certain embodiments of the present invention uses an anti-charge-injection switch to control a pre-charging process of a selected bit line. At the end of pre-charging, the anti-charge-injection switch is turned off. For example, the anti-charge-injection switch includes a switching transistor, and the charge injection cancellation transistors. Without the charge injection cancellation transistors, the electrons in the inversion layer of the switching transistor are dispersed to the both side of the switching transistor and make the voltage level of the selected bit line jump. Some embodiments of the present invention can detect a current by allowing the current to change the voltage level at one terminal of a comparator from the pre-charged voltage level. For example, the pre-charged voltage level is substantially equal to the reference voltage. In another example, the comparator compares the changing voltage level to the reference voltage for zero-crossing detection.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a system and method for high performance sense amplifier. Merely by way of example, the invention has been applied to a memory system. But it would be recognized that the invention has a much broader range of applicability.

Figure 1:
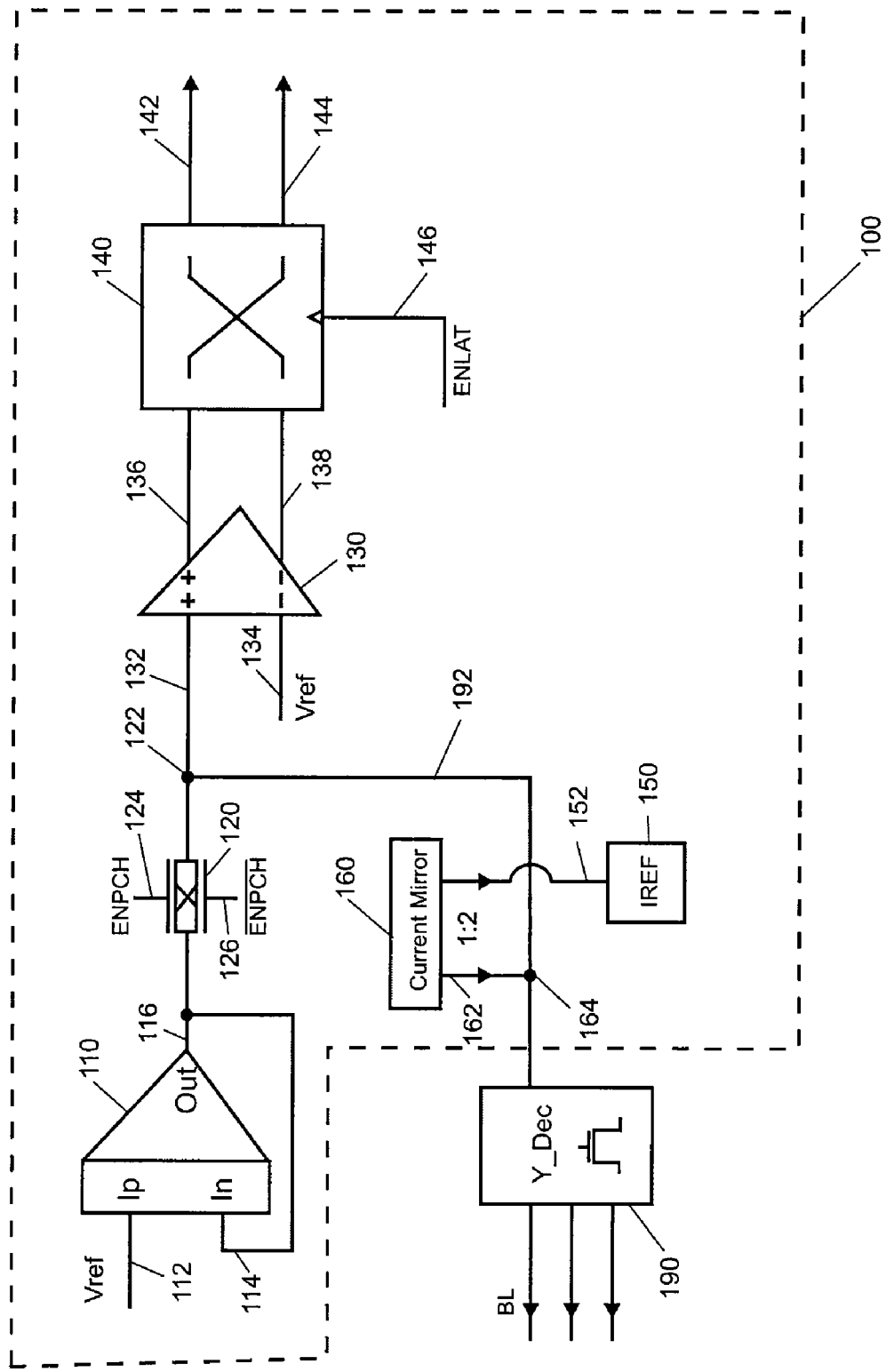
FIG. 1 is a simplified sense amplifier according to an embodiment of the present invention.

FIG. 1 is a simplified sense amplifier according to an embodiment of the present invention. This diagram is merely an example, which should not unduly limit the scope of the claims. One of ordinary skill in the art would recognize many variations, alternatives, and modifications. The system 100 includes the following components:

1. Operational amplifier 110;
2. Switch 120;
3. Amplifier 130;
4. Comparator 140;
5. Current reference device 150;
6. Current mirror 160.

Although the above has been shown using a selected group of components for the system 100, there can be many alternatives, modifications, and variations. For example, some of the components may be expanded and/or combined. Other components may be inserted to those noted above. Depending upon the embodiment, the arrangement of components may be interchanged with others replaced. For example, the system 100 serves as a sense amplifier. Further details of these components are found throughout the present specification and more particularly below.

The operational amplifier 110 includes a positive input terminal 112, a negative input terminal 114, and an output terminal 116. The positive input terminal 112 receives a reference voltage $V_{ref}$, and the negative input terminal 114 is connected to the output terminal 116. For example, the operational amplifier 110 acts as a unit-gain buffer. The output terminal 116 sends out an output voltage. For example, the output voltage is substantially equal to the reference voltage $V_{ref}$.

Figure 2:
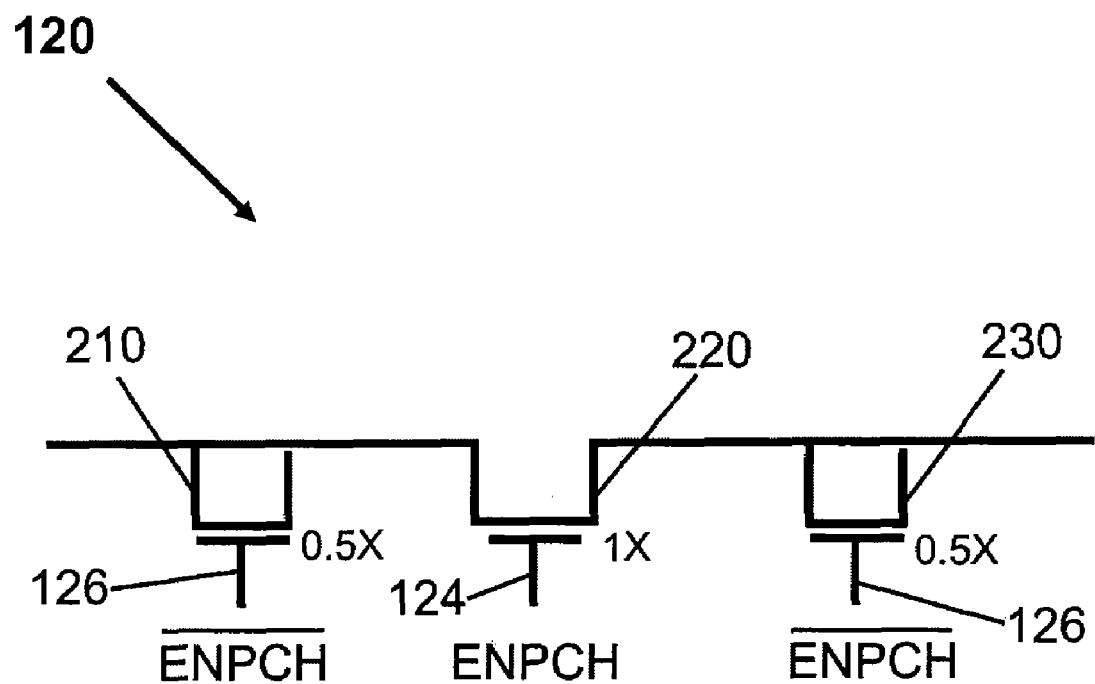
FIG. 2 is a simplified diagram showing a switch for a system according to an embodiment of the present invention.

The switch 120 controls the connection between the output terminal 116 and a node 122 in response to control signals 124 and 126. For example, the control signals 124 and 126 are complementary to each other. In another example, the control signal 124 is called ENPCH. FIG. 2 is a simplified diagram showing the switch 120 for the system 100 according to an embodiment of the present invention. This diagram is merely an example, which should not unduly limit the scope of the claims. One of ordinary skill in the art would recognize many variations, alternatives, and modifications. The switch 120 includes transistors 210, 220, and 230. Although the above has been shown using a selected group of components for the switch 120, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

The transistors 210 and 230 are controlled by the control signal 126, and the transistor 220 is controlled by the control signal 124. For example, the control signal 124 is an ENPCH signal, and the control signal 126 is complementary to the ENPCH signal. If the control signal 124 represents a logic high level, the control signal 126 represents a logic low level. If the control signal 124 represents a logic low level, the control signal 126 represents a logic high level. In another example, the source and the drain of the transistor 210 are shorted, and the source and the drain of the transistor 230 are also shorted. In yet another example, the switch is an anti-charge-injection switch. In yet another example, the source or drain of the transistor 210 is coupled to the output terminal 116, and the source or drain of the transistor 230 is coupled to the node 122.

In one embodiment, the transistor 220 performs the switching function for the switch 120. In another embodiment, the transistors 210 and 230 perform the charge injection cancellation function for the switch 120. In yet another embodiment, the transistors 210, 220, and 230 are NMOS transistors. If the control signal 124 is at the logic high level, the switch 120 is closed. The voltage level of the node 122 is adjusted to the output voltage of the output terminal 116. For example, the output voltage of the output terminal 116 is substantially equal to the reference voltage $V_{ref}$ as shown in FIG. 1. If the control signal 124 is at the logic low level, the transistor 220 is turned off, and the switch 120 is open. Also, the transistors 210 and 230 are turned on. For example, the electrons are released from the inversion layer of the transistor 220 and absorbed by the transistors 210 and 230. In yet another embodiment, the transistors 210, 220, and 230 have the same length, but the width of the transistor 210 and the width of the transistor 230 each are half of the width of the transistor 220. For example, the electrons released from the inversion layer of the transistor 220 are about evenly dispersed to the transistors 210 and 230.

The amplifier 130 includes input terminals 132 and 134 and output terminals 136 and 138. For example, the input terminal 132 is biased to the voltage level of the node 122, and the input terminal 134 is biased to the reference voltage $V_{ref}$. The amplifier 130 determines and amplifies the signal difference between the input terminals 132 and 134, and the amplified difference is output at the terminals 136 and 138. For example, the signals at the output terminals 136 and 138 have the same magnitude but different polarities. In another example, the signals at the output terminals 136 and 138 are in the voltage domain. In yet another embodiment, if the voltage at the input terminal 132 is higher than the voltage at the input terminal 134, the voltage at the output terminal 136 is higher than the voltage at the output terminal 138. In yet another embodiment, if the voltage at the input terminal 132 is lower than the voltage at the input terminal 134, the voltage at the output terminal 136 is lower than the voltage at the output terminal 138. In yet another embodiment, the voltage difference between the terminals 136 and 138 is significantly larger in magnitude than the voltage difference between the terminals 132 and 134. For example, this amplification can improve easiness and reliability of the comparison performed by the comparator 140.

The comparator 140 is coupled to the terminals 136 and 138, and includes output terminals 142 and 144 and a control terminal 146. In one embodiment, the control terminal 146 receives a control signal, such as the ENLAT signal. In another embodiment, the comparator 140 receives signals from the terminals 136 and 138 and compares the received signals to generate signals at the terminals 142 and 144. In yet another embodiment, the signals at the terminals 142 and 144 each are at the logic high level or the logic low level, and the signals at the terminals 142 and 144 are complementary. For example, if the voltage at the terminal 136 is higher than the voltage at the terminal 138, the signal at the terminal 142 represents "1" and the signal at the terminal 144 represents "0". In another example, if the voltage at the terminal 136 is lower than the voltage at the terminal 138, the signal at the terminal 142 represents "0" and the signal at the terminal 144 represents "1". In one embodiment, "1" corresponds to a voltage level of $V_{DD}$, and "0" corresponds to a voltage level of $V_{SS}$. In yet another embodiment, the comparator 140 differentiates the signals at the terminals 136 and 138 to the full swing with positive feedback. In yet another embodiment, the comparator 140 is a latch comparator. For example, the latch comparator includes a plurality of latches in cascade.

The current reference device 150 generates a sinking current 152 of $I_{ref}$. The sinking current 152 flows to the current reference device 150 from the current mirror 160. In response, the current mirror 160 generates a sourcing current 162. The sourcing current 162 flows from the current mirror 160 to a node 164. For example, the current 162 is half as large as the current 152 in magnitude. In another example, the current reference device 150 and the current mirror 160 form a current generator.

As shown in FIG. 1, the terminals 142 and 144 serve as output terminals of the system 100, and the node 164 serves as an input node of the system 100. In one embodiment, the system 100 serves as a sense amplifier, which is coupled to a memory system. For example, the memory system includes a read-only memory (ROM) system, such as an NAND ROM system or a flash memory system. In another example, the memory system includes word lines, bit lines, a decoder 190. The decoder 190 includes switches for connecting a selected bit line to the input node 164. For example, a bit line is selected, and a word line is also selected. The selected word line and the selected bit line correspond to a memory cell. The selected memory cell can generate a current $I_0$ flowing into the memory system from the sense amplifier 100 or generate no current based on information stored at the memory cell. For example, if the memory cell stores "0", the current is equal to $I_0$. In another example, if the memory cell stores "1", the current is equal to zero. In one embodiment, the magnitude of the current $I_{ref}$ is approximately equal to the average magnitude of the current $I_{ref}$ for memory cells storing "0".

Figure 3:
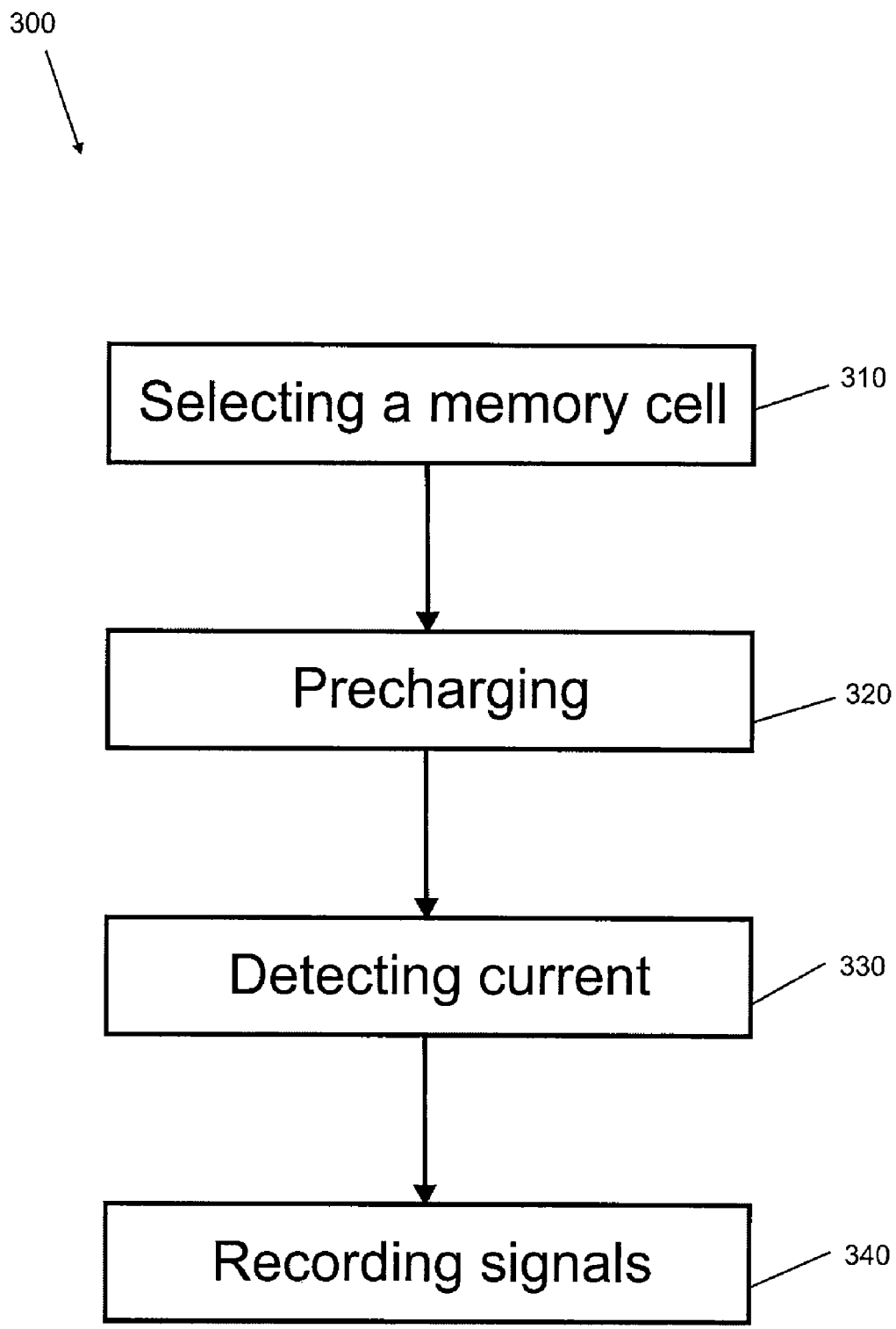
FIG. 3 is a simplified method for sensing current of a memory system according to an embodiment of the present invention.

FIG. 3 is a simplified method for sensing current of a memory system according to an embodiment of the present invention. This diagram is merely an example, which should not unduly limit the scope of the claims. One of ordinary skill in the art would recognize many variations, alternatives, and modifications. The method 300 includes the following processes:

1. Process 310 for selecting a memory cell;
2. Process 320 for precharging;
3. Process 330 for detecting current;
4. Process 340 for recording signals.

Although the above has been shown using a selected group of processes for the method 300, there can be many alternatives, modifications, and variations. For example, some of the processes may be expanded and/or combined. Other processes may be inserted to those noted above. Depending upon the embodiment, the arrangement of processes may be interchanged with others replaced. For example, the method 300 is performed by the sense amplifier 100 coupled to the decoder 190. Further details of these processes are found throughout the present specification and more particularly below.

At the process 310, a memory cell is selected. For example, a bit line is selected, and a word line is also selected. The selected word line and the selected bit line correspond to a selected memory cell. In another example, the voltage level of the selected word-line is at the logic high level, and the voltage levels of all other word lines is at the logic low level. In yet another example, the selected bit line is connected with the node 164 as shown in FIG. 1.

At the process 320, the selected bit line is pre-charged. In one embodiment, the switch 120 is turned on, and the voltage level of the node 122 is adjusted to the output voltage of the output terminal 116. Accordingly, the selected bit line is also charged through the switch 120 and the decoder 190. The voltage level of the selected bit line is substantially equal to $V_{REF}$. For example, the operational amplifier 110 has a high gain, and the difference between voltage level of the selected bit line and the reference voltage $V_{REF}$ is within 3 to 5 mV. The process 320 ends when the switch 120 is turned off.

At the process 330, the current of the selected memory cell is detected. For example, the selected memory cell can generate a current $I_0$ flowing into the memory system from the sense amplifier 100 or generate no current based on information stored at the memory cell. In one embodiment, if the memory cell stores "0", the current is equal to $I_0$. In another embodiment, if the memory cell stores "1", the current is equal to zero.

If the selected memory cell generates the current $I_0$ flowing into the memory system, a current 192 flowing from the node 122 to the node 164 is equal to the current $I_0$ minus the current 162. For example, the current 162 is equal to half of the current 152, and the current 192 is equal to $I_0-0.5\times I_{ref}$. Accordingly, the voltage level of the node 122 decreases with time from the reference voltage $V_{ref}$. For example, the voltage level of the node 122 drops by approximately a rate of $i/C_{bl}$. i represents the magnitude of the current 192, and $C_{bl}$ represents the total capacitance of the selected bit line and the line between the nodes 122 and 164.

If the selected memory cell generates no current, the current 192 flows from the node 164 to the node 122 and is equal to the magnitude of current 162. For example, the current 162 is equal to half of the current 152, and the current 192 is equal to $0.5\times I_{ref}$ in magnitude. Accordingly, the voltage level of the node 122 increases with time from the reference voltage $V_{ref}$. For example, the voltage level of the node 122 rises by approximately a rate of $i/C_{bl}$. i represents the magnitude of the current 192, and $C_{bl}$ represents the total capacitance of the selected bit line and the line between the nodes 122 and 164.

At the process 340, signals that are related to the detected current are recorded. As shown in FIG. 1, the difference between the voltage level at the node 122 and the reference voltage $V_{ref}$ is amplified by the amplifier 130. The amplifier 130 outputs two differential signals at the terminals 136 and 138, which are received by the comparator 140. For example, the comparator 140 compares, amplifies, and stores the received signals in response to the control signal at the terminal 146. In one embodiment, the signals are compared and amplified when the ENLAT signal is at the logic high level, and the amplified signals are preserved when the ENLAT signal is at the logic low level.

Figure 4:
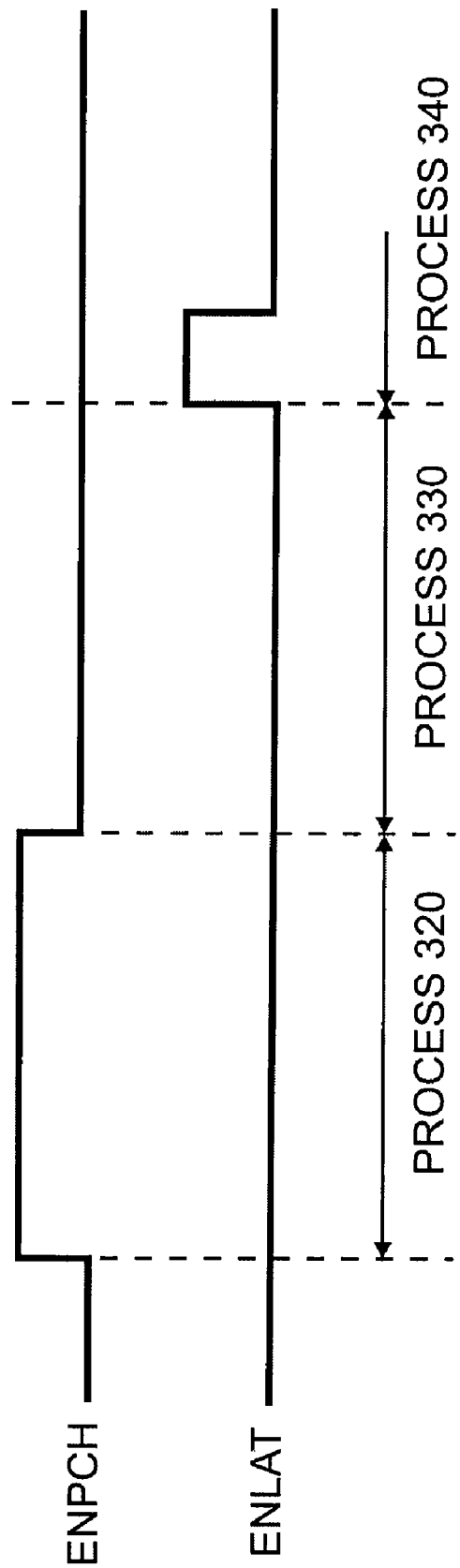
FIG. 4 is a simplified diagram showing control signals for a method for sensing current of a memory system according to an embodiment of the present invention.

FIG. 4 is a simplified diagram showing control signals for the method 300 according to an embodiment of the present invention. This diagram is merely an example, which should not unduly limit the scope of the claims. One of ordinary skill in the art would recognize many variations, alternatives, and modifications. As discussed above, the sense amplifier 100 is controlled by the signals 124, 126, and 146. For example, the signals 124 and 126 are determined by the ENPCH signal, and the signal 128 is determined by the ENLAT signal. During the process 320, the ENPCH signal remains at the logic high level, and the ENLAT signal remains at the logic low level. For example, the ENPCH signal turns on the switch 120. In another example, the time period for the process 320 ranges from 3 ns to 30 ns. During the process 330, both the ENPCH signal and the ENLAT signal remain at the logic low level. For example, the time period for the period 330 ranges from 5 ns to 30 ns. During the process 340, the ENPCH signal remains at the logic low level. The ENLAT signal rises to the logic high level and after a period of time drops to the logic low level.

According to another embodiment of the present invention, a system for sensing a current includes an operational amplifier including a first input terminal, a second input terminal, and a first output terminal. The first input terminal is biased to a predetermined voltage, and the second input terminal and the first output terminal are directly connected. Additionally, the system includes a switch coupled to the first output terminal and a first node. The switch is controlled by at least a first control signal. Moreover, the system includes a comparator including a third input terminal, a fourth input terminal, and at least a second output terminal. The comparator is configured to receive a first input signal at the third input terminal and a second input signal at the fourth input terminal. The first input signal and the second input signal are associated with the first node and the predetermined voltage. Also, the system includes a current generator coupled to a second node and configured to generate a first current. The first current flows between the current generator and the second node. The first node and the second node are directly connected, and a second current flows between the first node and the second node. The second node is coupled to a device configured to generate a third current, and the third current flows between the device and the second node. For example, the system is implemented according to the system 100.

According to yet another embodiment of the present invention, a system for sensing a current includes an operational amplifier including a first input terminal, a second input terminal, and a first output terminal. The first input terminal is biased to a predetermined voltage, and the second input terminal and the first output terminal are directly connected. Additionally, the system includes a switch coupled to the first output terminal and a first node, and the switch is controlled by at least a first control signal. Moreover, the system includes a comparator including a third input terminal, a fourth input terminal, and at least a second output terminal. The comparator is configured to receive a first input signal at the third input terminal and a second input signal at the fourth input terminal, and the first input signal and the second input signal being associated with the first node and the predetermined voltage. Also, the system includes a reference generator configured to generate a predetermined current, and a current mirror coupled to the reference generator and a second node and configured to generate a first current. The first current is proportional to the predetermined current. The predetermined current flows from the current mirror to the reference generator, and the first current flows from the current mirror to the second node. The first node and the second node are directly connected. A second current flows between the first node and the second node, and the second node is coupled to a bit line for a memory system. The memory system is configured to generate no current on the bit line or a third current on the bit line. If the memory system generates no current on the bit line, the second current flows from the second node to the first node. If the memory system generates the third current on the bit line, the second current flows from the first node to the second node. For example, the system is implemented according to the system 100.

According to yet another embodiment of the present invention, a method for sensing a current includes selecting a memory cell in a memory system. The selected memory cell corresponds to at least a selected bit line, and the memory system is coupled to a sense amplifier. The sense amplifier includes an operational amplifier including a first output terminal substantially biased to a predetermined voltage, a switch coupled to the first output terminal and a first node and controlled by at least a first control signal, a comparator including a first input terminal and a second input terminal, a current generator coupled to a second node and configured to generate a first current flowing between the current generator and the second node. The second node is coupled to the selected bit line, and the first node and the second node are directly connected. The first input terminal and the second input terminal are associated with the first node and the predetermined voltage. Additionally, the method includes turning on the switch by at least the first control signal, adjusting a voltage level at the first node to be substantially equal to the predetermined voltage, and turning off the switch by at least the first control signal. Moreover, the method includes increasing or decreasing the voltage level at the first node from being substantially equal to the predetermined voltage, and detecting a difference between the voltage level at the first node and the predetermined voltage. The selected memory cell is at either a first state or a second state. The increasing or decreasing the voltage level at the first node includes if the selected memory cell is at the fist state increasing the voltage level, and if the selected memory cell is at the second state decreasing the voltage level. For example, the method is implemented according to the method 300.

The present invention has various advantages. Some embodiments of the present invention provide a system and method for sensitive and fast sense amplifier. For example, the sense amplifier uses an operational amplifier to pre-charge a selected bit line to a reference voltage through an anti-charge-injection switch. After the pre-charging, the bit-line voltage would remain very close to the reference voltage. Certain embodiments of the present invention significantly facilitate read operations of read-only memory (ROM) systems that have low currents. For example, the sensitivity of the read operations are significantly improved. In another example, the speed of the read operations are significantly improved. Some embodiments of the present invention use an operational amplifier to automatically balance a selected bit line to a reference voltage during pre-charging. Certain embodiments of the present invention uses an anti-charge-injection switch to control a pre-charging process of a selected bit line. At the end of pre-charging, the anti-charge-injection switch is turned off. For example, the switch 120 is an anti-charge-injection switch. In another example, the switch 120 includes the transistors 210, 220, and 230. In one embodiment, the transistor 220 serves as a switching transistor, and the transistors 230 and 240 serve as the charge injection cancellation transistors. Without the charge injection cancellation transistors, the electrons in the inversion layer of the switching transistor are dispersed to the both side of the switching transistor and make the voltage level of the selected bit line jump. Some embodiments of the present invention can detect a current by allowing the current to change the voltage level at one terminal of a comparator from the pre-charged voltage level. For example, the pre-charged voltage level is substantially equal to the reference voltage. In another example, the comparator compares the changing voltage level to the reference voltage for zero-crossing detection.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for sensing a state in a bit line associated with a memory cell that is programmable to a first state and a second state, the apparatus comprising:
   an operational amplifier coupled to a reference voltage and configured to output a voltage substantially equal to the reference voltage;
   a switch coupled to the voltage at a first terminal and a first node at a second terminal, the switch being controlled by a first control signal;
   a first input terminal configured to receive the bit line, the bit line being coupled to a current generator at a second node;
   an amplifier including a second input terminal coupled to the first node and a third input terminal coupled to the reference voltage, the amplifier being configured to generate a first differential output signal and a second differential output signal, the first and second differential output signals having different polarities; and
   a comparator including a fourth input terminal coupled to the first differential output signal, a fifth input terminal coupled to the second differential output signal and a first output terminal, the comparator being configured to generate an output signal based on the polarities of the first and second differential output signals;
   wherein:
   the current generator generates a first current, the first current flowing between the current generator and the second node;
   the first and second nodes are directly connected;
   a second current flows between the first and second nodes.

2. The apparatus of claim 1 wherein the switch comprises a first transistor, a second transistor, and a third transistor, the second transistor being interposed between the first and third transistors and being turned on and off under the control of the first control signal.

3. The apparatus of claim 2 wherein the first and third transistors are turned on and off under the control of a second control signal, the second control signal having a logic state complementary to the logic state of the first control signal.

4. The apparatus of claim 2 wherein the first, second and third transistors have the same length, and the first and third transistors have a width about one half the width of the second transistor.

5. The apparatus of claim 1 wherein the current generator comprises:
   a reference generator configured to generate a predetermined current;
   a current mirror coupled to the reference generator and configured to generate the first current, the first current being proportional to the predetermined current.

6. The apparatus of claim 1 wherein the bit line generates a third current, the third current having a first current magnitude associated with the first state of the memory cell and a second current magnitude associated with the second state of the memory cell.

7. The apparatus of claim 6 wherein the second current flows from the first node to the second node if the third current has the first current magnitude; and the second current flows from the second node to the first node if the third current has the second current magnitude.

8. A method of sensing a current of a bit line associated with a memory cell, the method comprising:

providing a voltage to a switch, the voltage being substantially equal to a reference voltage, the voltage being further coupled with an amplifier through a switch at a first node;

selecting the bit line associated with the memory cell, the bit line being coupled to a current generator at a second node;

precharging the selected bit line to the voltage by turning on the switch;

turning off the switch;

detecting a current by measuring a difference between the voltage at the bit line and the reference voltage using the amplifier, the amplifier having a second input terminal coupled to the first node, a third input terminal coupled to the reference voltage;

amplifying the difference; and latching the amplified difference wherein:

the current generator generates a first current, the first current flowing between the current generator and the second node;

the first and second nodes are directly connected;

a second current flows between the first and second nodes.

9. The method of claim 8 wherein the selecting the bit line comprises connecting a current generator to the selected bit line; the current generator being configured to provide a first current to the selected bit line.

10. The method of claim 8 wherein the precharging the selected bit line comprises a first control signal configured to turn on the switch having a first terminal coupled to the voltage and a second terminal coupled to a first node.

11. The method of claim 8 wherein the detecting a current comprises generating a third current on the bit line, the third current having a first current magnitude associated with a first state of the memory cell and a second current magnitude associated with a second state of the memory cell.

12. The method of claim 11 wherein the second current flows from the first node to the second node if the third current has the first current magnitude; and the second current flows from the second node to the first node if the third current has the second current magnitude.

13. The method of claim 8 wherein the switch comprises a first transistor, a second transistor, and a third transistor, the second transistor being interposed between the first and second transistors and being turned on and off under the control of a first control signal, and the first and third transistors being turned on and off under the control of a second control signal, wherein the second control signal having a logic state complementary to the logic state of the first control signal.

14. The method of claim 13 wherein the first, second and third transistors have the same length, and the first and third transistors have a width about one half the width of the second transistor.

15. An apparatus for sensing a state at a node, the apparatus comprising:

a unity gain buffer coupled to a reference voltage and configured to provide a voltage substantially equal to the reference voltage;

a switch coupled to the voltage at a first end and configured to transfer the voltage to a second end under the control of a first control signal;

a comparator having a first input terminal coupled to the second end of the switch and a second input terminal coupled to the reference voltage, the comparator being configured to generate an output signal based on the difference between the voltage and the reference voltage at the respective first and second input terminals; and a current generator coupled to the node and configured to increase the voltage at the first input terminal if the state at the node is at a first state and decrease the voltage if the state is at a second state.

16. The apparatus of claim 15 wherein the switch comprises a first transistor, a second transistor, and a third transistor, the second transistor being interposed between the first and third transistors and being turned on and off under the control of the first control signal.

17. The apparatus of claim 16 wherein the first and third transistors are turned on and off under the control of a second control signal, the second control signal having a logic state complementary to the logic state of the first control signal.

18. The apparatus of claim 16 wherein the first, second and third transistors have the same length, and the first and third transistors have a width smaller than the width of the second transistor.

19. The apparatus of claim 15 wherein the current generator comprises:

a reference generator configured to generate a predetermined current;

a current mirror coupled to the reference generator and the node and configured to generate a first current, the first current being proportional to the predetermined current.

20. The apparatus of claim 15 wherein the comparator further comprises a latch configured to latch the output signal under the control of a third control signal.

\* \* \* \* \*